United States Patent [19]

Gurian et al.

[11] Patent Number: 4,620,894

[45] Date of Patent: Nov. 4, 1986

[54] APPARATUS FOR PROCESSING CIRCUIT BOARD SUBSTRATE

[75] Inventors: Marshall I. Gurian; Don P. Pender, both of Phoenix, Ariz.

[73] Assignee: Advanced Systems Incorporated, Phoenix, Ariz.

[21] Appl. No.: 710,700

[22] Filed: Mar. 11, 1985

[51] Int. Cl.⁴ .......................... C23F 1/02; B44C 1/22; C03C 15/00; C03C 25/06
[52] U.S. Cl. ..................................... 156/345; 156/640
[58] Field of Search ............... 156/345, 640, 641, 642, 156/656, 659.1, 666, 901, 902; 134/198

[56] References Cited

U.S. PATENT DOCUMENTS

| | | | |
|---|---|---|---|
| 2,822,635 | 2/1958 | Mears | 156/640 |
| 3,795,561 | 3/1974 | Bond et al. | 156/640 X |
| 4,371,422 | 2/1983 | Eidschun | 156/640 |

*Primary Examiner*—William A. Powell
*Attorney, Agent, or Firm*—Drummond & Nissle

[57] ABSTRACT

Method and apparatus for chemically treating vertically oriented electronic printed circuit board substrates. The apparatus includes a conveyor system for transporting vertically oriented circuit board substrates through a plurality of adjacent spray chambers. The conveyor system minimizes the amount of chemical solution which is carried from one chamber into an adjoining chamber and permits the utilization of hollow slack tubing to engage and transport the substrates.

4 Claims, 11 Drawing Figures

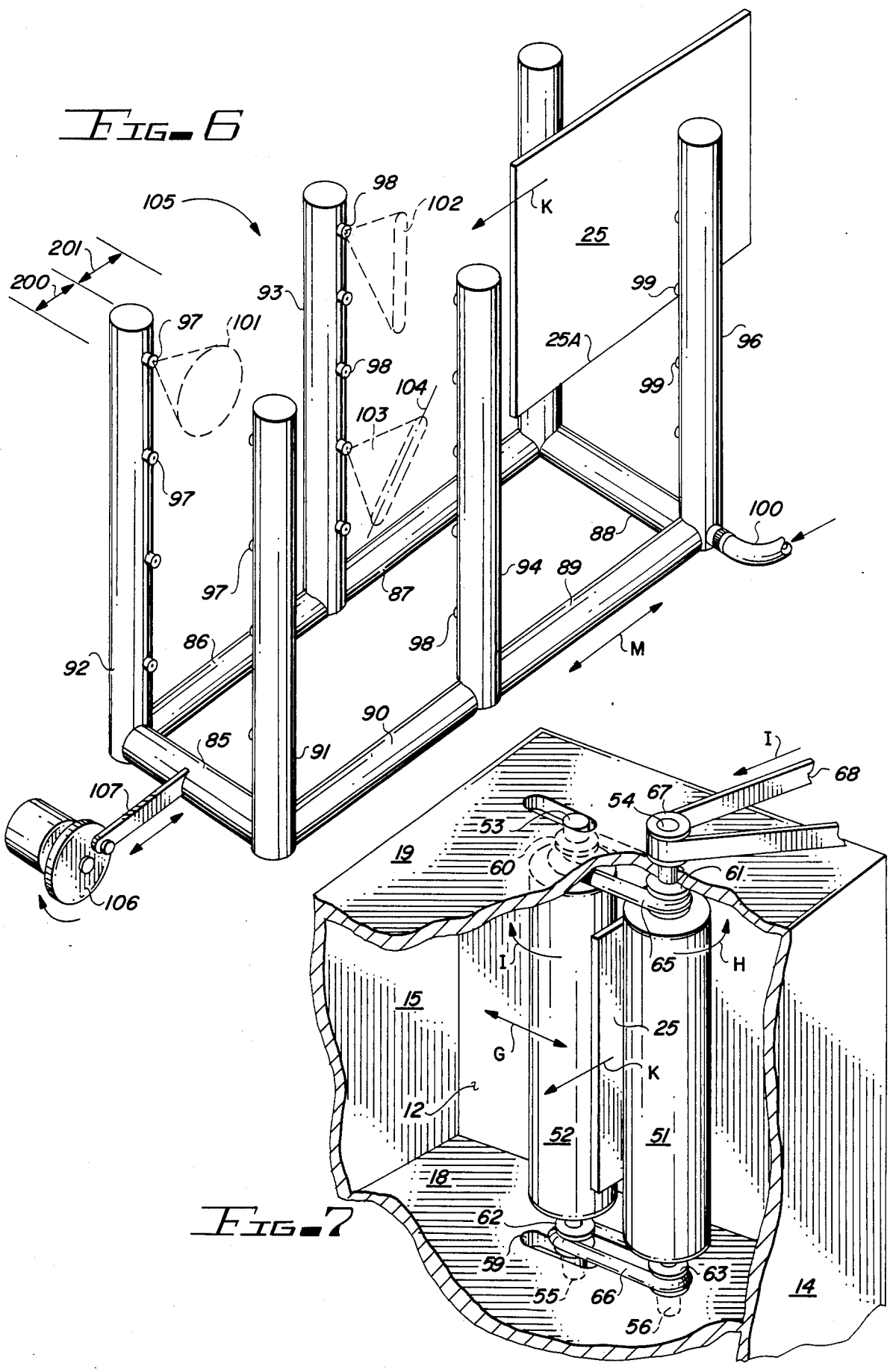

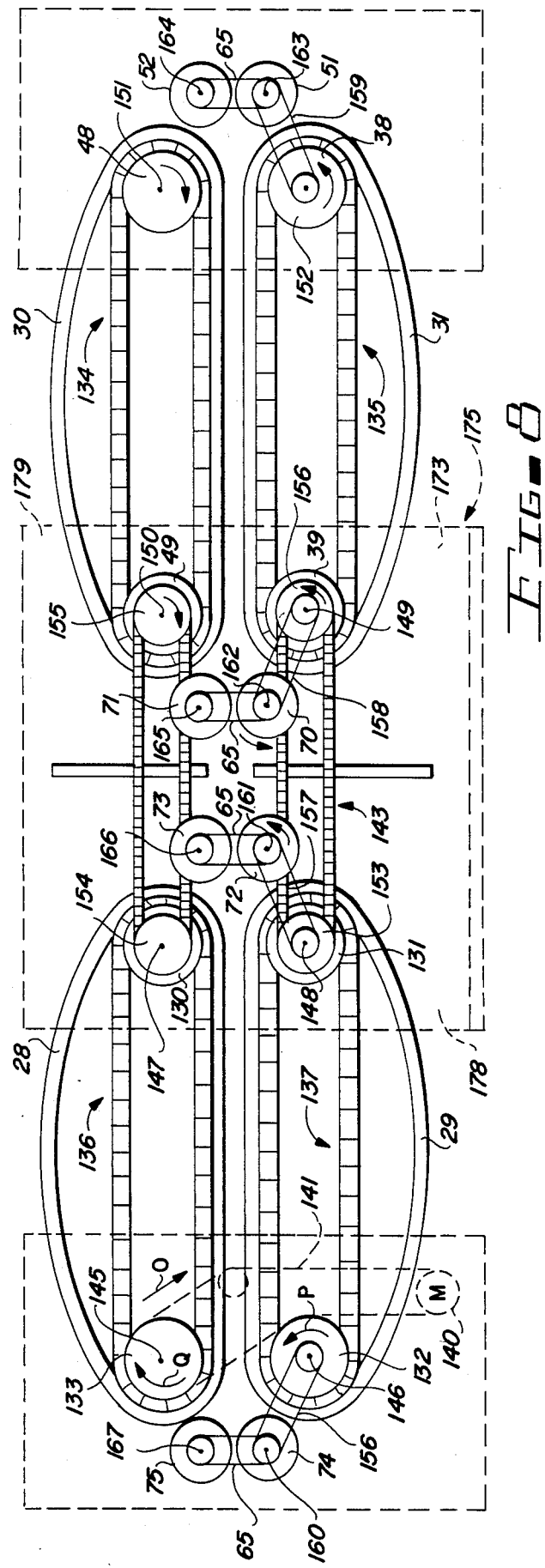
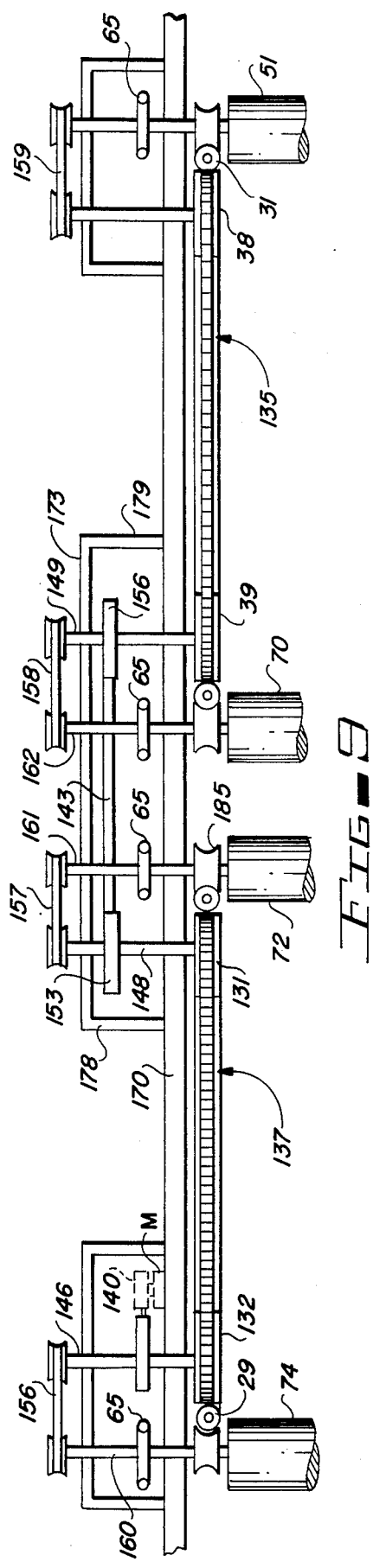
Fig-8
Fig-9

APPARATUS FOR PROCESSING CIRCUIT BOARD SUBSTRATE

This invention relates to a method and apparatus for etching and otherwise chemically treating electronic printed circuit board substrates.

More particularly, the invention relates to a method and apparatus for uniformly applying spray etchants, rinses and other chemical processing solutions to vertically oriented circuit board substrates during horizontal transport of the substrates.

In a further respect, the invention pertains to a conveyor system for contacting and transporting vertically oriented circuit board substrates through a plurality of adjacent spray chambers, the section of the conveyor system contacting and transporting the circuit board substrates through one spray chamber being discrete and separate from the sections of the conveyor system in each of the other adjoining spray chambers.

In another respect, the invention pertains to a conveyor system for transporting vertically oriented circuit board substrates through a plurality of adjacent spray chambers, the conveyor system both minimizing the amount of chemical solution which is carried from one chamber into an adjoining chamber, and permitting the utilization of hollow, slack tubing to engage and transport circuit board substrates.

During the spray processing of vertically oriented circuit board substrates, the substrates are commonly transported in a generally horizontal direction of travel through a series of spray etchant and rinse chambers. Several problems are associated with such treatment of printed circuit board substrates. First, excess etchant fluid tends to accumulate and cling to the lower portions of the vertically oriented substrates, resulting in uneven etching of the substrates. Further, etchant fluid from spray nozzles strike separate points on the substrates at differing angles, causing variations in the volume and contact force of the spray and, consequently, causing uneven etching rates across the surface of the substrate. Another problem connected with the spray etching of circuit board substrates is that etchant spray coats the clips, hooks and other mechanisms utilized to engage and transport the circuit board through the etchant spray chamber. Etchant fluid adhering to clips, hooks, etc. is then carried from the spray chamber into the rinse chamber, increasing the consumption of chemical etchant and rinse fluid during processing of circuit board substrates.

Accordingly, it would be highly desirable to provide improved circuit board substrate spray apparatus which would transport vertically oriented circuit board substrates through a plurality of adjoining spray chambers, would tend to apply to each point on the surfaces of the circuit board substrates the amount of etchant necessary to insure a uniform etching rate over the surface of each substrate, would minimize the accumulation of excess etchant along the lower portion of the circuit board substrates, and would minimize the amount of spray fluid carried by the substrates from one spray chamber to adjoining chambers.

Therefore, it is a principal object of the invention to provide improved apparatus for processing printed circuit board substrates.

Another object of the instant invention is to provide improved printed circuit board processing apparatus which would generally apply to each point on the surfaces of vertically oriented circuit board substrates the amount of etchant necessary to insure a uniform etching rate over the entire surface of each substrate.

A further object of the invention is to provide improved printed circuit board processing apparatus which applies chemical solutions to circuit board substrates being transported through a plurality of adjoining spray chambers and minimizes the amount of chemical solution carried by the substrates from one spray chamber to an adjoining spray chamber.

Still another object of the invention is to provide improved printed circuit board processing apparatus which tends to compensate for the accumulation of excess etchant chemicals along the lower portion of sprayed circuit board substrates.

Yet another object of the instant invention is to provide an improved conveyor system for transporting vertically oriented circuit board substrates through a plurality of adjoining spray chambers, the portion of the conveyor system in each spray chamber being discrete and separate from the portions of the conveyor system in each of the adjoining chambers to minimize the transfer of spray solution from one spray chamber to an adjoining chamber.

These and other, further and more specific objects and advantages of the invention, will be apparent to those skilled in the art from the following detailed description thereof, taken in conjunction with the drawings, in which:

FIG. 4 is a perspective view of an alternate embodiment of the hollow resilient conveyor tube utilized to contact and transport circuit board substrate through the spray apparatus of the invention;

FIG. 5 is a perspective view of still another embodiment of the hollow resilient conveyor tube utilized to contact and transport circuit board substrate through the processing apparatus of the invention;

FIG. 6 is a perspective view of the oscillating spray mechanism utilized in the apparatus of FIG. 1;

FIG. 7 is a perspective view of the adjustable squeegee rollers utilized in the spray apparatus of FIG. 1; and, FIGS. 8 to 11 illustrate an alternate embodiment of the apparatus of the invention.

Briefly, in accordance with our invention, we provide improved apparatus for processing vertically oriented renitent circuit board substrate panels. The apparatus includes means for transporting the circuit board substrate panels; and, means for directing a fluid spray against the substrate panel while the panel is being displaced by the circuit board transporting means. The circuit board substrate panel transporting means includes first and second sets of tube support members circulating in respective closed paths, portions of each path being in opposed, spaced apart, parallel relationship with portions of the other path; first and second hollow resilient continuous tube members each operatively associated with one of the sets of tube support members, portions of each of the resilient tube members contacing and being laterally displaced in a direction of travel by the support members of the associated set traveling in parallel portions of the path thereof, bearing against and compressing portions of the other when contacting and being transported by the support members of the associated set traveling in the parallel portion of the path thereof, and, bearing against vertically oriented substrate panels interposed between the tube members to maintain the panels in generally fixed positions with respect to the portions of the tube members contacting the panels during transport of the panels in the direction of travel. The apparatus also includes means for moving the tube support members along their respective paths. The apparatus has at least one spray nozzle and can also include means for oscillating the spray nozzle during transport of the circuit board panels in the direction of travel by the circuit board panel transporting means. The portions of each resilient continuous tube member or contact a circuit board panel are slack.

Figure 1:
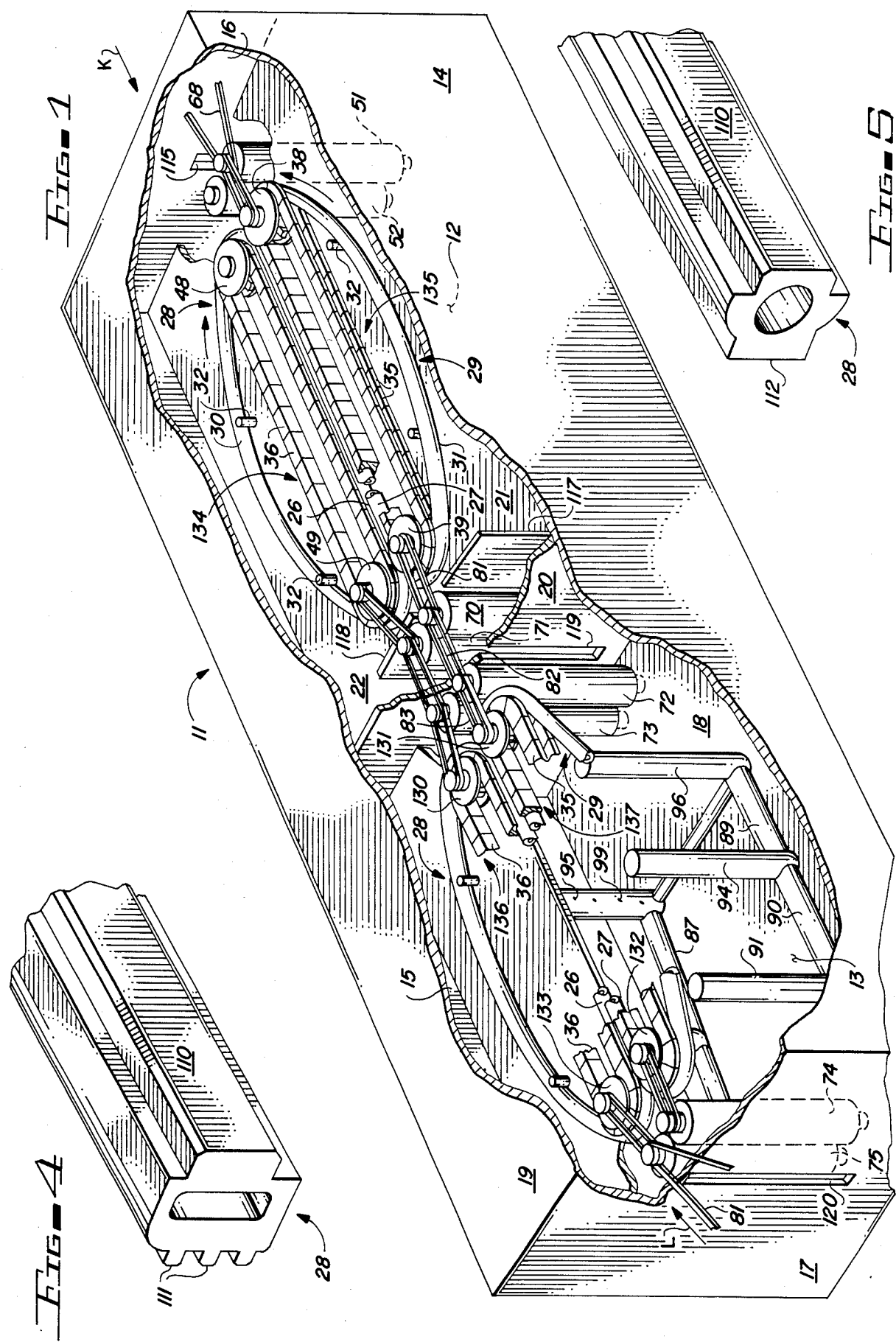
FIG. 1 is a perspective view of circuit board substrate processing apparatus constructed in accordance with the principles of the invention.
Figure 2:
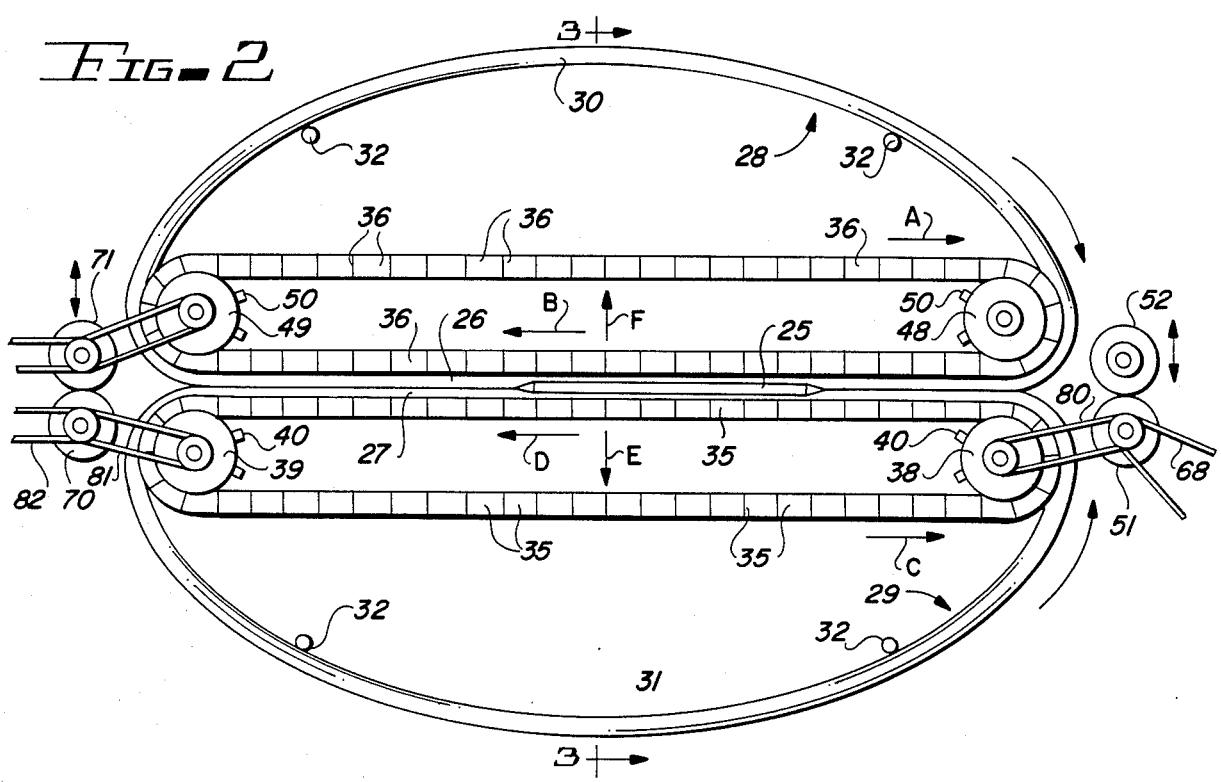
FIG. 2 is a bottom view of a portion of the apparatus of FIG. 1 illustrating a circuit board substrate conveyor section thereof.
Figure 3:
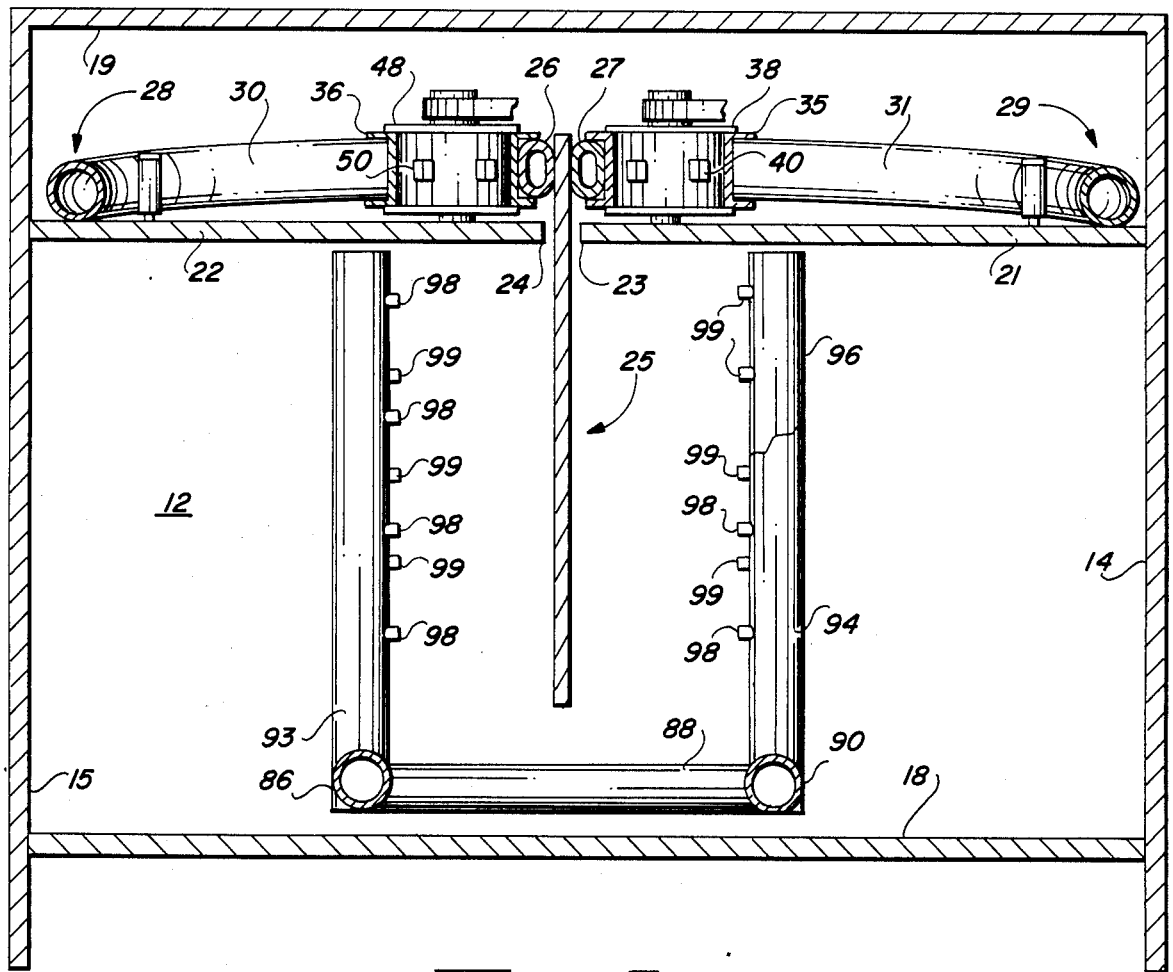
FIG. 3 is a section view of the conveyor section of FIG. 2 taken along section line 2—2 thereof and further illustrating construction details thereof and of spray apparatus operatively associated therewith.

Turning now to the drawings, which depict the presently preferred embodiments and best mode of the invention for the purpose of illustrating the practice thereof and not by way of limitation of the scope of the invention, and in which like reference characters refer to corresponding elements throughout the several views, FIGS. 1-3 illustrate the presently preferred embodiment of the invention including housing 11 enclosing spray chambers 12, 13 and including side walls 14 and 15 and end walls 16 and 17. Floor 18 and top 19 span the distance between end walls 16, 17. Vertically oriented wall 20 divides housing 11 and separates spray chambers 12, 13. Horizontally oriented spaced apart ceiling panels 21, 22 form the ceiling for spray chamber 12. Spaced apart, opposed, parallel edges 23, 24 of panels 21, 22 (FIG. 3) define an elongate horizontal opening through which circuit board substrate travels when being transported by the opposed, compressed portions 26, 27 of hollow elongate resilient continuous tube members 28, 29. Portions 30, 31 of each tube member 28, 29 not contacting the other tube member and not contacting a substrate panel 25 being carried between the tube pair 28, 29 are generally slack and pass loosely around pegs 32. A first set of interconnected Ushaped tube support members 35 extends around and is displaced along an oval-shaped path by sprockets 38, 39 rotatably mounted in ceiling panel 21. Outwardly projecting teeth 40 on sprockets 38, 39 engage U-shaped support members 35 moving around sprockets 38, 39. A second set of interconnected U-shaped tube support members 36 extends around and is displaced along an oval-shaped path by sprockets 48, 49 rotatably mounted in ceiling panel 22. Outwardly projecting teeth 50 on sprockets 48, 49 engage U-shaped tube support members 36 moving around sprockets 38, 39 such that members 36 move along an oval path of travel in a clockwise direction as indicated by arrows A, B in FIG. 2. Sprockets 38, 39 cause U-shaped support members 35 to move along an oval path of travel in the counterclockwise direction of travel indicated in FIG. 2 by arrows C and D. The U-shaped support members 35 moving in the direction of arrow D in FIG. 2 and supporting section 27 of hollow tube 29 are parallel to and spaced apart from the U-shaped support members 36 moving in the direction of arrow B and supporting section 26 of hollow tube 28. Although omitted from FIG. 2 for the sake of clarity, a first elongate support member is fixedly connected to ceiling panel 21 immediately behind U-shaped members 35 contacting tube section 27. The first elongate support member spans the distance between sprockets 38, 39 and prevents members 35 supporting tube section 27 from being bowed inwardly in the direction of arrow E. A second elongate support member (not shown) is attached to ceiling panel 22 and spans the distance between sprockets 48, 49 to prevent U-shaped members 36 contacting tube section 26 from being bowed inwardly in the direction of arrow F. The first and second elongate support members are necessary because when tube sections 26, 27 contact and are compressed against one another in the manner illustrated in FIG. 3, compressed resilient tube sections 26, 27 attempt to expand to their normal cylindrical shape and, consequently, tend to force tube support members 35, 36 in the directions of arrows E and F.

Squeegee roller pair 51, 52 is rotatably mounted in floor 18 and ceiling 19 as illustrated in FIG. 7. Axles 53. 55 are rotatably carried in elongate oval slots 58, 59 which permit roller 52 to be laterally displaced with respect to roller 51 in the manner indicated by arrows G. Roller 51 turns in the direction indicated by arrow H. Roller 52 turns in the direction indicated by arrow I. Spools 60, 61, 62, 63 are freely rotatably carried on axles 53, 54, 55, 56, respectively. Continuous tensioned elastic band 65 passes around spools 60 and 61 and forces roller 52 against roller 51. Tensioned elastic band 66 passes around spools 62, 63 and also draws roller 52 against roller 51. Spool 67 is fixedly attached to axle 54. A motor or other motive power means (not shown) causes belt 68 to travel in the direction of arrow I and rotate axle 54 and roller 51 in the direction indicated by arrow H. When roller 51 contacts roller 52, roller 51 causes roller 52 to rotate in the direction of arrow I. The passage of a substrate panel 25 between rollers 51, 52 stretches elastic bands 65, 66 and causes roller 52 to be displaced away from roller 51 in the manner shown in FIG. 7. When rollers 51, 52 are being driven by primary drive belt 68, spools 60-63 normally remain in stationary position on their respective rotating axles. Squeegee roller pairs 70 and 71, 72 and 73, and 74 and 75 are rotatably mounted in floor 18 and their respective spray chamber ceiling panel members in a manner similar to that illustrated in FIG. 7 for roller pair 51, 52.

The arrangement of resilient tubes 28, 29 and support members 35, 36 above the ceiling of spray chamber 13 is substantially identical to the arrangement of support members 35, 36 and tubes 28, 29 above ceiling members 21, 22 of spray chamber 12.

Auxiliary belt 80 transfers motive power from roller 51 to sprocket 38. When belt 80 rotates sprocket 38, interconnected support members 35 rotate sprocket 39. When sprocket 39 rotates, auxiliary belt 81 transfers motive power from sprocket 39 to squeegee roller 71. Auxiliary belt 82 transfers motive power from squeegee roller 70 to roller 72; auxiliary belt 83 transfers motive power from roller 72 to the sprocket driving members 35 along a path adjacent the ceiling of spray chamber 13. Primary drive belt 84 moves in the direction of arrow L and, in a manner similar to that just described for the auxiliary belts associated with primary drive belt 68, a series of associated auxiliary belts transmits motive power from belt 84 to the rollers and sprockets opposed to and operatively associated with rollers 51, 38, 39, 70, 72 and 74. As would be apparent to those skilled in the art, a variety of motor-belt arrangements could be utilized to provide the motive power to drive the rollers, belts, tubing and sprockets of the apparatus of FIG. 1.

In FIG. 1 the spray apparatus utilized in chamber 12 is blocked from view by horizontal ceiling panels 21, 22. The spray apparatus utilized in chamber 12 is generally equivalent to that utilized in chamber 13 and is illustrated in FIGS. 3 and 6. Spray assembly 105 includes interconnected hollow members 85-96, each member being in fluid communication with other members attached thereto. Fluid directed into hollow members 85-96 through conduit 100 passes through nozzles 97 on members 91 and 92; through nozzles 98 on members 93 and 94; and, through nozzles 99 on vertically oriented members 95 and 96. To help insure uniform fluid distribution over the vertical surface of a circuit board substrate panel 25, nozzles having differing overlapping spray distrubution patterns are utilized, where the spray distribution pattern is the pattern that spray from a nozzle makes on striking the surface of a circuit board substrate panel 25. Certain nozzles have a conical spray pattern 101, while others have a fan-shaped spray pattern 102, 103. The spray pattern from one nozzle on a vertical member 91-96 overlaps the spray pattern from an immediately adjacent nozzle on the same member 91-96. Angling of the fan-shaped spray patterns in the manner indicated by dashed lines 103 is preferred because an angled fan-shaped spray 103 functions in a manner similar to that of a windshield wiper and tends to minimize the accumulation of fluid along the lower edge 25A of a substrate 25. In FIG. 6 the longitudinal axis 104 of fan spray pattern 103 is at an angle of 45° from the vertical. The angle of axis 104 from the vertical can be varied as desired.

A spray assembly 105 is movably mounted in each spray chamber 12, 13 and is pivotally connected to a rotating centric 106 by a rod 107. When centric 106 rotates, it displaces rod 107 and causes spray assembly 105 to oscillate back and forth in the manner indicated by arrown M in FIG. 6. Oscillation of spray assembly 105 during transport of substrates 25 through spray chambers 12 or 13 appears to insure a more uniform distribution of spray over the vertical surfaces of the substrates.

In the presently preferred apparatus, when a substrate panel 25 passes through a spray chamber in which etchant fluid or some other fluid is being applied by spray assembly 105, approximately the initial 40% of the spray nozzles passed by the substrate 25 produce a conical spray pattern while the remaining nozzles produce a fan-shaped spray pattern. Such combinations of conical and fan-shaped spray patterns appear to more nearly produce uniform etching across the entire surface of a substrate than do a group of spray patterns which are all conical.

As a further mean for facilitating a uniform spray distribution across the surface of substrate 25, the vertical position of nozzles on members 91-96 is varied. This feature of spray assembly 105 is illustrated in FIG. 3, where nozzles 98 of members 93, 94 have vertical positions differing from those of nozzles 99 on members 95, 96.

As is depicted in FIGS. 1-3, slack portions 30, 31 of hollow tube members 28, 29 have a cylindrical shape and a circular cross section. Members 28, 29 can also take the forms illustrated in FIGS. 4 and 5 and have bottom portions 110 specially adapted to engage U-shaped members 35, 36 and have front surfaces 111, 112 specially adapted to securely engage a circuit board substrate 25 passing between portions 26 and 27 of tube members 28, 29.

In use, the motors or other means providing motive power to primary belts 68, 84 are operated to turn the various rollers and sprockets in the apparatus of FIG. 1. Each centric 106 (FIG. 6) is actuated to begin oscillating its respective spray assembly 105 in processing chambers 12 and 13. Fluid is coursed through resilient conduits 100 into each spray assembly 105. A vertically oriented circuit board substrate panel 25 is fed in the direction indicated by arrow K through vertical slot 115 in wall 16 and between rollers 51, 52. Rollers 51, 52 guide the upper edge of substrate 25 between opposed compressed sections 26, 27 of tube members 28, 29 in the manner illustrated in FIGS. 2 and 3. Sections 26, 27 are compressed by support members 36, 35 against the upper edge of substrate 25 (FIG. 3) and maintain the substrate in fixed position with respect to the portions of sections 26, 27 contacting substrate 25. While substrate 25 is transported through chamber 12 by portions 26, 27 of moving belts 28, 29, etchant spray from assembly 105 in chamber 12 strikes the vertical surfaces of substrate 25. Substrate 25 passes between spray shields 117 and 118, between squeegee roller pair 70 and 71, through vertical opening 119 in wall 20, and, between squeegee roller pair 72, 73. After passing between roller pair 72, 73, the upper portion of substrate 25 is engaged by and compressed between sections 26, 27 of tubes 28, 29 positioned above spray chamber 13. Spray assembly 105 in chamber 13 applies a rinse solution to the vertical surfaces of substrate 25. After being carried through rinse chamber 13 by tube portions 26, 27, substrate 25 exits through squeegee roller pair 74 and 75 and vertical opening 120 in wall 17.

A particular advantage of the apparatus of FIG. 1 is that each spray chamber is provided with its own discrete conveyor section 28, 29 which functions both to grasp and transport substrate 25 and, along with the ceiling panels in the chambers, to protect the drive sprockets and support members 35, 36 from contact with spray fluids. The apparatus of FIG. 1 accordingly minimizes the corrosion of the conveyor drive components and also virtually eliminates etchant and other chemical solutions being carried by substrate panel transport mechanisms from one spray chamber to another adjoining spray chamber. In addition, the utilization of hollow resilient tubing 28, 29 having slack sections 30, 31 facilitates the even compression of tube sections 26, 27 as members 28, 29 are drawn around sprockets 38, 48 and against one another. The utilization of slack tube members 28, 29 also facilitates the removal and replacement of the tube members.

As utilized herein, the terms circuit board substrate and circuit board substrate panels encompass any panel shaped piece of material susceptible to chemical spray treatment.

FIGS. 8-11 depict an alternate embodiment of the invention in which a drive system different from that of FIG. 1 is utilized to rotate squeegee rollers 51, 52, 70-75; sprockets 38, 48, 39, 49, 130-133; and, chains 134-137. Motor 140 drives chain 141 in the direction indicated by arrows 0. Chain 141 rotates shaft 146 in the direction of arrow P. Sprocket 132 is connected to shaft 146. Motive power is transmitted through chain 137 from sprocket 132 to sprocket 131 carried on shaft 148. Sprocket 153 displaces chain 143 and turns sprocket 156 connected to shaft 149. Chain 135 transmits motive power from sprocket 39 connected to shaft 149 to sprocket 38 carried on shaft 152. Belts 156–159 transmit motive power from shafts 146, 148, 149 and 152 to shafts 160–163 connected to squeegee rollers 74, 72, 70 and 51, respectively. Consequently, when motor 140 rotates shaft 146 in the direction of arrow P, motive power is transferred to and rotates sprockets 131, 39, 38, 153, 156 and rollers 74, 72, 70 and 51 in the counterclockwise direction of arrow P.

Chain 141 rotates shaft 145 in the clockwise direction of arrow Q. Motive power is transmitted through chain 136 from sprocket 133 attached to shaft 145 to sprocket 130 attached to shaft 147. Chain 144 transmits motive power from sprocket 154 carried on shaft 147 to sprocket 155 attached to shaft 150. Motive power from sprocket 49 attached to shaft 150 is transmitted via chain 134 to sprocket 48 carried on shaft 151. Accordingly, during operation of the apparatus of FIGS. 8–11, each sprocket 133, 130, 154, 155, 49, 48 rotates along with its respective shaft in the direction of arrow Q.

In FIG. 8 each squeegee roller 52, 71, 73 and 75 is slidably mounted such that it can, as it can in the apparatus of FIG. 1, be laterally displaced in the direction of arrows G (FIG. 7) toward and away from its associated squeegee roller 51, 70, 72 and 74, respectively. Tensioned O-ring bands 65 span and interconnect the upper shafts 163 and 164, 162 and 165, 161 and 166, and, 160 and 167 of each opposed squeegee roller pair in the manner generally illustrated in FIG. 7, i.e., each band 65 does not rotate during operation of the apparatus of FIGS. 8–11 but merely functions to pull one of rollers 52, 71, 73 and 75 against its opposing roller 51, 70, 72 and 74, respectively. When each roller 52, 71, 73 and 75 is pulled against and contacts its driven roller 51, 70, 72, and 74, respectively, the movement of the driven roller 51, 70, 72 and 74 causes its opposing roller 52, 71, 73 and 75 to turn.

Figure 11:
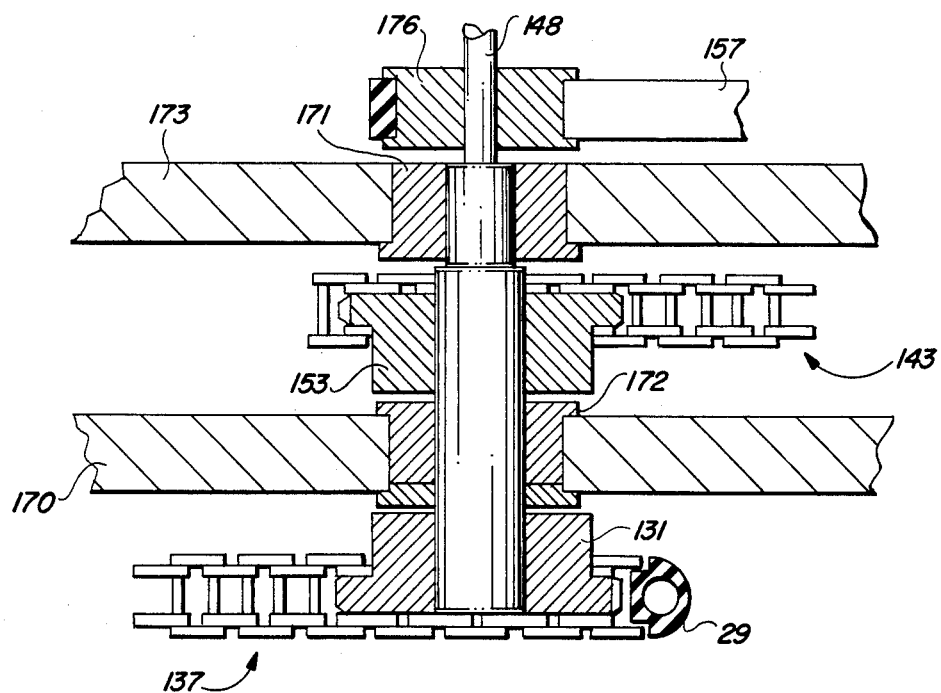

FIG. 11 is a section view of shaft 148 and the components which are attached to and rotate with shaft 148. Shaft 148 rotates in bushings 171 and 172 implaced in horizontal panel member 173 of U-shaped support stand 175 and in chamber ceiling 170 of spray chamber 13. Pulley 176, sprocket 153 and sprocket 131 are fixedly attached to and rotate with shaft 148. The cross-sectional view of shaft would be generally equivalent to the cross-sectional view of shaft 148 shown in FIG. 11. U-shaped support stand 173 also includes upstanding legs 178 and 179.

Figure 10:
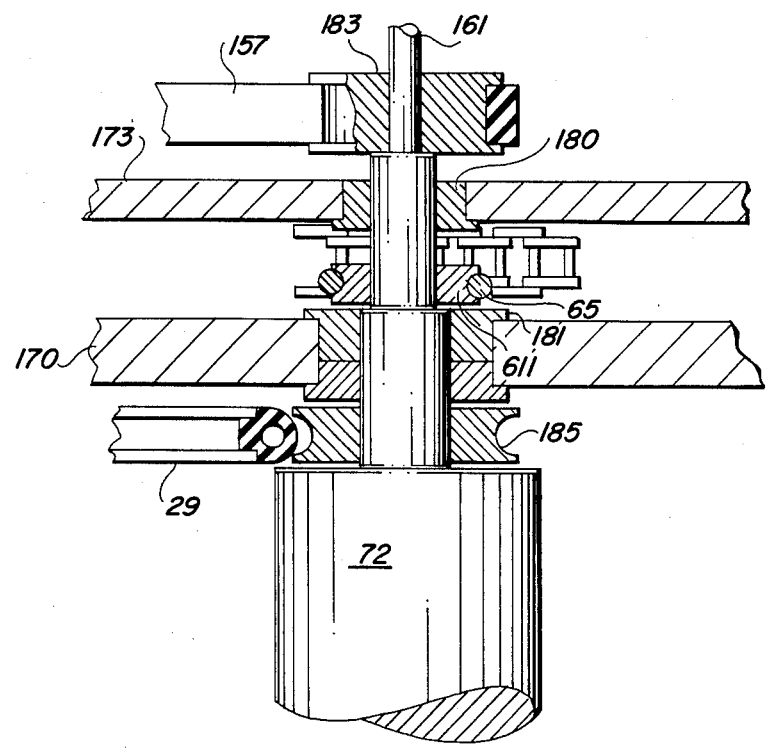

FIG. 10 is a section view of the upper portion of shaft 161 and squeegee 72 fixedly attached thereto. Shaft 161 rotates in bushings 180 and 181 implaced in horizontal panel 173 of U-shaped bearing support stand 175 and in chamber ceiling 170, respectively. Belt 157 from pulley 176 passes around pulley 183 connected to shaft 161. Belt 157 transmits motive power from shaft 148 and rotates shaft 161 during operation of the apparatus of the invention. Free-floating pulley 61 carries tensioned O-ring 65 which, as was earlier described, passes around a similar free floating pulley on the shaft of roller 73 to pull roller 73 against roller 72. Pulley 61 and tensioned O-ring 65 do not rotate during operation of the apparatus. Free floating pulley 185 contacts and guides conveyor belt 29 passing intermediate sprocket 131 and guide 185. As would be appreciated by those of skill in the art, the section view of shaft 162 would be generally equivalent to the section view of shaft 161 shown in FIG. 10.

To facilitate the assembly of the apparatus of the invention, each squeegee roller pair may be mounted in the apparatus so the position of a squeegee roller pair 51 and 52, 70 and 71, 72 and 73, or 74 and 75 may be vertically adjusted in the directions indicated by arrows Z in FIG. 7.

As would be appreciated by those of skill in the art, if chamber 13 is a drying chamber, it is not necessary to include squeegee pair 74, 75 in the apparatus of FIG. 8.

Pegs 32 in FIGS. 1 and 2 are preferably omitted from the apparatus to permit hollow tube members 28, 29 to slide freely over surfaces 21 and 22 when tube members 28, 29 are not engaged by and between chains 35, 36. The free, slack movement of portions 30, 31 of members 28, 29 over surfaces 21, 22 is important to proper functioning of the apparatus of the invention.

Having described our invention in such terms as to enable those skilled in the art to which it pertains to understand and practice it, and having described the presently preferred embodiments thereof, we claim:

1. Apparatus for processing vertically oriented circuit board substrates including
   (a) means for transporting said circuit board substrates, including
      (i) first and second sets of tube support members circulating in respective closed paths, portions of each path being in opposed, spaced-apart, parallel relationship with portions of the other path;
      (ii) first and second hollow resilient continuous tube members each operatively associated with one of said sets of tube support members, portions of each of said resilient tube members
         contacting and being laterally displaced in a direction of travel by said support members of said associated set traveling in said parallel portions of said path thereof,
         bearing against and compressing portions of the other when contacting and being transported by said support members of said associated set traveling in said parallel portions of said path thereof, and
         bearing against said vertically oriented substrate interposed between said tube members to maintain said substrate in generally fixed position with respect to said portions contacting said substrate during transport thereof in said direction of travel,
   (b) means for directing a fluid spray against said substrate while said substrate is transported by said circuit board transporting means; and,
   (c) means for moving said tube support members along said paths.

2. The apparatus of claim 1 wherein said spray means includes at least one spray nozzle.

3. The apparatus of claim 2 including means for oscillating said spray nozzle during transport of said substrate in said direction of travel by said circuit board transporting means.

4. The apparatus of claim 1 wherein portions of each resilient continuous tube member not contacting said other continuous tube member or said substrate are slack.

* * * * *